US012622098B2

(12) United States Patent
Zeng

(10) Patent No.: US 12,622,098 B2
(45) Date of Patent: May 5, 2026

(54) DISPLAY BACKPLANE AND MOBILE TERMINAL

(71) Applicant: Guangzhou China Star Optoelectronics Semiconductor Display Technology Co., Ltd., Guangzhou (CN)

(72) Inventor: Yuhua Zeng, Guangzhou (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 832 days.

(21) Appl. No.: 17/754,381

(22) PCT Filed: Mar. 15, 2022

(86) PCT No.: PCT/CN2022/080802
§ 371 (c)(1),
(2) Date: Mar. 31, 2022

(87) PCT Pub. No.: WO2023/159690
PCT Pub. Date: Aug. 31, 2023

(65) Prior Publication Data
US 2024/0113255 A1 Apr. 4, 2024

(30) Foreign Application Priority Data
Feb. 28, 2022 (CN) .......................... 202210187275.5

(51) Int. Cl.
*H10H 20/814* (2025.01)
*H04M 1/02* (2006.01)
(Continued)

(52) U.S. Cl.
CPC ........ *H10H 20/814* (2025.01); *H04M 1/0266* (2013.01); *H10H 29/142* (2025.01); *H10W 90/00* (2026.01); *H10H 20/882* (2025.01)

(58) Field of Classification Search
CPC .. H10H 20/814; H10H 29/142; H10H 20/882; H10H 20/853; H10H 20/855;
(Continued)

(56) References Cited

U.S. PATENT DOCUMENTS

2008/0137335 A1 6/2008 Tsai et al.
2013/0164472 A1* 6/2013 Liu ..................... C09D 11/037
428/34.1
(Continued)

FOREIGN PATENT DOCUMENTS

CN 106773289 A 5/2017
CN 108983497 A 12/2018
(Continued)

OTHER PUBLICATIONS

International Search Report in International application No. PCT/CN2022/080802, mailed on Nov. 30, 2022.
(Continued)

*Primary Examiner* — Yasser A Abdelaziez

(57) ABSTRACT

Disclosed is a display backplane and a mobile terminal. The display backplane includes a substrate, a light-emitting layer, and a protective layer. The light-emitting layer is disposed on the substrate, and the protective layer is disposed on the substrate. An accommodating groove is disposed on a surface of the protective layer facing the substrate, and the light-emitting unit is located in the accommodating groove.

20 Claims, 3 Drawing Sheets

(51) Int. Cl.
   *H10H 29/14*         (2025.01)
   *H10W 90/00*         (2026.01)
   *H10H 20/80*         (2025.01)

(58) Field of Classification Search
   CPC ............. H10H 20/856; H01L 25/0753; H04M
                                       1/0266; G09F 9/33
   See application file for complete search history.

(56)                References Cited

U.S. PATENT DOCUMENTS

| | | | |
|---|---|---|---|
| 2016/0274415 A1* | 9/2016 | Gu ....................... | G02B 6/0021 |
| 2020/0050360 A1* | 2/2020 | Jeon ................... | G06V 40/1306 |
| 2020/0051959 A1* | 2/2020 | Pschenitzka ........ | H01L 25/0753 |
| 2021/0098664 A1* | 4/2021 | Bando ................. | H10H 29/142 |

FOREIGN PATENT DOCUMENTS

| | | |
|---|---|---|
| CN | 109509401 A | 3/2019 |
| CN | 110727145 A | 1/2020 |
| CN | 113671751 A | 11/2021 |
| JP | 2008041546 A | 2/2008 |
| WO | 2013114452 A1 | 8/2013 |

OTHER PUBLICATIONS

Written Opinion of the International Search Authority in International application No. PCT/CN2022/080802, mailed on Nov. 30, 2022.
Chinese Office Action issued in corresponding Chinese Patent Application No. 202210187275.5 dated Jul. 2, 2025, pp. 1-7.

* cited by examiner

DISPLAY BACKPLANE AND MOBILE TERMINAL

TECHNICAL FIELD

The present application relates to the field of display, and in particular, to a display backplane and a mobile terminal.

BACKGROUND

At present, a mini light-emitting diode (Mini LED) chip has a size ranging from 50 to 200 microns, and its contact area with a pad is small, resulting in low soldering adhesion to the chip. Therefore, it is necessary to package the Mini LED chip to prevent the chip from falling off due to external force.

A Mini LED display screen is prone to cause problems that lamp beads are lit at an undesired location or failed in certain positions in the course of use. In this case, the display screen needs to be return to the factory for replacement of a lamp board. In a conventional Mini LED chip packaging mode, a Mini LED substrate soldered with a chip is covered by a die-bonding glue, the glue is cured into a layer to adhere to the chip. Therefore, when the lamp board is required to return to the factory for replacement, it is impossible to replace a single chip if a chip is bad or failed, and it is necessary to replace the entire lamp board, making maintenance costs high and resource waste serious.

TECHNICAL PROBLEMS

An embodiment of the present application provides a dimming layer for a display module and the display module to solve technical problems that lamp beads are lit at an undesired location or failed in certain positions during use of a current Mini LED display screen and a single chip cannot be replaced after being defective or failed and thus needs to be returned to a factory for replacement of a whole lamp board, thereby achieving low maintenance cost and decreasing waste of resources.

TECHNICAL SOLUTIONS

To solve the above problems, the present application provides the following technical solutions.

An embodiment of the present application provides a display backplane, comprising:

a substrate;

a light-emitting layer disposed on the substrate and including a plurality of light-emitting units arranged at intervals; and a protective layer disposed on the substrate, wherein an accommodating groove is disposed on a surface of the protective layer facing the substrate, and the light-emitting unit is located in the accommodating groove.

In an embodiment, the display backplane includes a reflective microstructure surrounding a periphery of the light-emitting unit and located within the accommodating groove.

In an embodiment, the reflective microstructure includes a plurality of protrusions having a diameter in the range of 3 μm-16 μm.

In an embodiment, the display backplane includes a semi-transparent layer disposed on a surface of the protective layer away from the substrate, and an orthographic projection of the semi-transparent layer on the substrate covers an orthographic projection of the light-emitting layer on the substrate.

In an embodiment, the semi-transparent layer includes a plurality of sub-semi-transparent layers, one of the sub-semi-transparent layers corresponds to one of the light-emitting units, and an orthographic projection of the sub-semi-transparent layer on the substrate covers an orthographic projection of the corresponding light-emitting unit on the substrate.

In an embodiment, the protective layer is provided with a scattering layer covering the protective layer and the semi-transparent layer.

In an embodiment, an adhesive layer is disposed between the protective layer and the substrate, and the adhesive layer securely adheres the protective layer and the substrate.

In an embodiment, the adhesive layer is disposed around the light-emitting layer.

In an embodiment, at least one of the light-emitting units is disposed in one of the accommodating grooves.

In an embodiment, a depth of the accommodating groove is greater than a height of the light-emitting layer in a direction perpendicular to the substrate.

In addition, the present application further provides a mobile terminal comprising a display backplane and a terminal body, the terminal body being integrated with the display backplane.

The display backplane includes:

a substrate;

a light-emitting layer disposed on the substrate and including a plurality of light-emitting units arranged at intervals; and a protective layer disposed on the substrate, wherein an accommodating groove is disposed on a surface of the protective layer facing the substrate, and the light-emitting unit is located in the accommodating groove.

In an embodiment, the display backplane includes a reflective microstructure surrounding a periphery of the light-emitting unit and located within the accommodating groove.

In an embodiment, the reflective microstructure includes a plurality of protrusions having a diameter in a range of 3 μm-16 μm.

In an embodiment, the display backplane includes a semi-transparent layer disposed on a surface of the protective layer away from the substrate, and an orthographic projection of the semi-transparent layer on the substrate covers an orthographic projection of the light-emitting layer on the substrate.

In an embodiment, the semi-transparent layer includes a plurality of sub-semi-transparent layers, one of the sub-semi-transparent layers corresponds to one of the light-emitting units, and an orthographic projection of the sub-semi-transparent layer on the substrate covers an orthographic projection of the corresponding light-emitting unit on the substrate.

In an embodiment, the protective layer is provided with a scattering layer covering the protective layer and the semi-transparent layer.

In an embodiment, an adhesive layer is disposed between the protective layer and the substrate, and the adhesive layer securely adheres the protective layer and the substrate.

In an embodiment, the adhesive layer is disposed around the light-emitting layer.

In an embodiment, at least one of the light-emitting units is disposed in one of the accommodating grooves.

In an embodiment, a depth of the accommodating groove is greater than a height of the light-emitting layer in a direction perpendicular to the substrate.

BENEFICIAL EFFECTS

In the present application, a protective layer is provided on the substrate, the protective layer covers the light-emitting layer, an accommodating groove is disposed on a surface of the protective layer facing the light-emitting layer, and the light-emitting unit is positioned in the accommodating groove. By this configuration, the light-emitting unit is not adhered to the protective layer after packaging, and the light-emitting layer can be protected. When the light-emitting unit is defective and needs to be returned to the factory for replacement in the subsequent process, the protective layer can be removed and then the light-emitting unit can be replaced separately without replacing the entire lamp board, thereby reducing the maintenance cost of the display backplane and saving energy and being environmentally friend.

EMBODIMENTS OF THE PRESENT DISCLOSURE

The present application provides a dimming layer for a display module and the display module. In order to make the objectives, technical solutions and effects of the present application more clear and explicit, the following describes the present application in detail with reference to the accompanying drawings and embodiments. It should be understood that the specific embodiments described herein are used to explain the present application only and are not intended to limit the present application.

Embodiments of the present application provide a display panel and a preparation method thereof. Detailed description will be given below. It should be noted that the order of description of the following embodiments is not a limitation on the preferred order of the embodiments.

At present, a Mini LED chip has a size ranging from 50 to 200 microns, and its contact area with a pad is small, resulting in low soldering adhesion force of the chip. Therefore, it is necessary to package the Mini LED chip to prevent the chip from falling off due to external force.

A Mini LED display screen is prone to cause problems that lamp beads are lit at an undesired location or are failure in certain positions in the course of use. In this case, it is necessary to return the display screen to the factory for replacement of a lamp board. In a conventional Mini LED chip packaging mode, a Mini LED substrate soldered with a chip is covered by a die-bonding glue, and the glue is cured into a layer to adhere to the chip. Therefore, when requiring to return to the factory to replace the lamp board, it is impossible to replace a single chip when a single chip is bad or failed, so it is necessary to replace the entire lamp board, which results in high maintenance costs and a serious waste of resources.

In order to solve the problems, the present application provides the following technical solutions referring to FIGS. 1 to 7.

Figure 1:
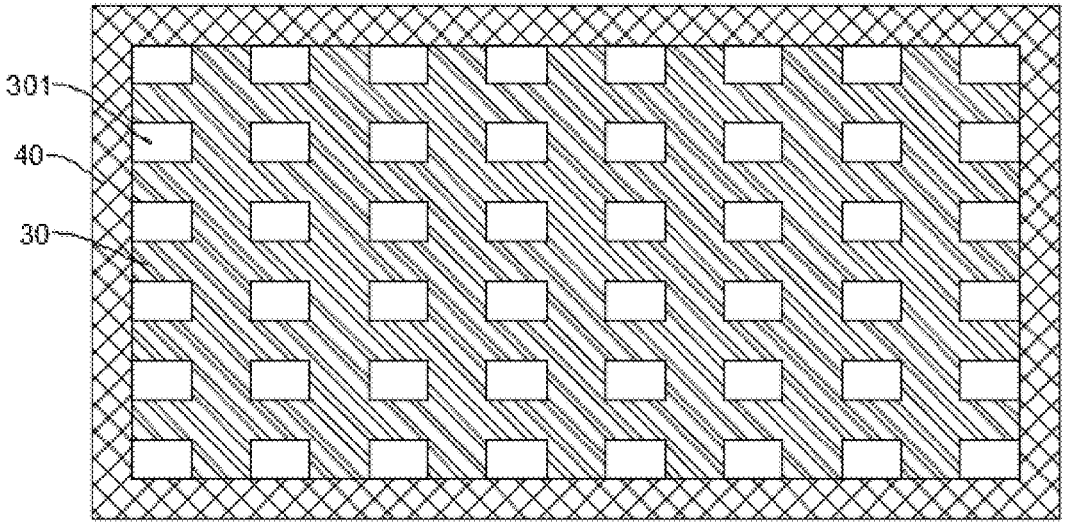
FIG. 1 is a schematic top view of a display backplane according to an embodiment of the present application.
Figure 2:
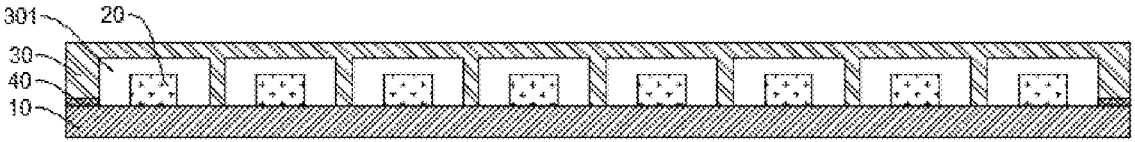
FIG. 2 is a schematic structural view of another display backplane according to an embodiment of the present application.

An embodiment of the present application provides a display backplane, as shown in FIGS. 1 and 2, comprising:

a substrate 10;

a light-emitting layer disposed on the substrate 10 and including a plurality of light-emitting units 20;

a protective layer 30 disposed on the substrate 10, wherein accommodating grooves 301 are provided on a surface of the protective layer 30 facing the substrate 10, and the light-emitting units 20 are located in the accommodating grooves 301.

Specifically, the display backplane may be a backlight module of a display panel for providing a backlight, or a display panel having a display function. In this embodiment, a Mini LED display screen is illustrated as an example.

It should be noted that the existing Mini LED packaging process includes molding and glue spraying. In the molding process, a Mini LED substrate 10 is put into a mold, glue is injected into the mold, cured and molded. In the process, a lot of glue is demanded, a thickness of the finished product obtained by mechanical die pressing has large tolerances, and the packaging process is complicated. The glue spraying process includes charging a formulated glue into a needle tube in a glue dispensing machine, spraying the glue onto a Mini LED substrate with a pressure valve, and baking the glue at a high temperature for curing after completion of the spraying. The glue used in both of the above-mentioned processes is a die-bonding glue having an optical grade resin as a main component which is expensive.

Specifically, the substrate 10 may be a conventional glass substrate 10, or may be a substrate 10 with a control circuit layer for controlling the switch and brightness of the light-emitting unit 20.

Specifically, the light-emitting layer includes a plurality of light-emitting units 20 arranged in an array. The arrangement mode of the light-emitting units 20 is not limited, and may be designed according to actual production requirements. The light-emitting units 20 may be Mini LED.

Specifically, the protective layer 30 disposed on the light-emitting layer is used for packaging the Mini LED, preventing faults in normal display of the Mini LED due to the erosion of weld legs of the Mini LED by water molecules in the air.

Specifically, a material used for the protective layer 30 is a high light-transmittance material having a certain hardness, for example, glass, polymethyl methacrylate (PMMA), polystyrene (PS), polycarbonate (PC) and the like. There is a demand for its hardness for two reasons. On the one hand, it is necessary to ensure that after the protective layer 30 is molded, its upper surface is flat and does not collapse so as to avoid pressing the Mini LED chip. On the other hand, the protective layer 30 needs to be support in the subsequent preparation process, so that on the protective layer 30, a coating can be applied or other functional films can be directly placed. The above material may be used to effectively replace a die-bonding glue in the prior art, which can prevent the protective layer 30 from bonding to Mini LED chips, thus enabling the replacement of a single Mini LED chip as needed during the subsequent return to the factory for maintenance, effectively reducing the cost for maintenance.

Specifically, the protective layer 30 is connected to the substrate 10 by, for example, bonding with a sticky optical adhesive, mechanical clamping or the like. All manners that can connect the protective layer 30 to the substrate 10 are within the scope of the present application.

Specifically, as shown in FIG. 2, an accommodating groove 301 is disposed on a surface of the protective layer 30 facing the light-emitting layer, and a light-emitting unit 20 is positioned in the accommodating groove 301. The accommodating groove 301 and the substrate 10 together form a holding cavity, and the light-emitting unit 20 on the substrate 10 is positioned in the holding cavity. The accommodating groove 301 may have a height slightly higher than that of the light-emitting unit 20, and the edge of the accommodating groove 301 may be configured to be close to the light-emitting unit 20 or be spaced a certain distance from the light-emitting unit 20.

Specifically, the accommodating groove 301 may be provided in multiple. One accommodating groove 301 may accommodate one light-emitting unit 20, or may accommodate a plurality of light-emitting units 20. The accommodating grooves 301 may be arranged depending on the arrangement of the light-emitting units 20.

Specifically, a surface of the protective layer 30 away from the substrate 10 may be a planar structure.

It can be understood that in the present application, by providing a protective layer 30 on the substrate 10, the protective layer 30 covering the light-emitting layer, and providing an accommodating groove 301 on a surface of the protective layer 30 facing the light-emitting layer to allow the light-emitting unit 20 to be located in an accommodation cavity formed by the accommodation groove 301 and the substrate 10, after packaging, the protective layer 30 does not bond to the light-emitting unit 20, while protecting the light-emitting layer. When a light-emitting unit 20 in the subsequent process has a failure and needs to be returned to the factory for replacement, the protective layer 30 can be removed and the single light-emitting unit 20 is then replaced, without replacing the entire lamp board, thereby reducing the maintenance cost of the display backplane, saving energy and being environmentally friend.

In an embodiment, as shown in FIGS. 1 and 2, an adhesive layer 40 is disposed between the protective layer 30 and the substrate 10, and the adhesive layer 40 securely adheres the protective layer 30 and the substrate 10.

Specifically, a material used for the adhesive layer 40 may be an optical adhesive material. The adhesive layer 40 may be provided only at an outer edge of the surface of the protective layer 30 facing the substrate 10 to surround the light-emitting layer, or may be coated on an entire surface of the protective layer 30 contacting with the substrate 10.

Figure 5:
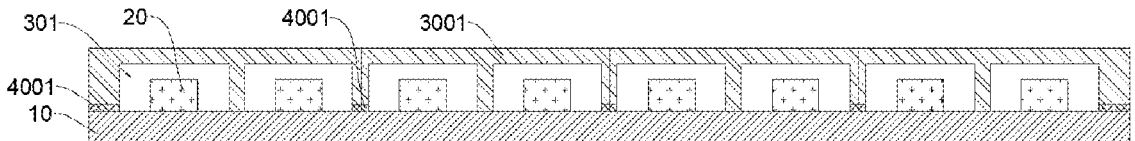
FIG. 5 is a schematic structural view of a display backplane having a plurality of sub-protective layers according to an embodiment of the present application.
Figure 6:
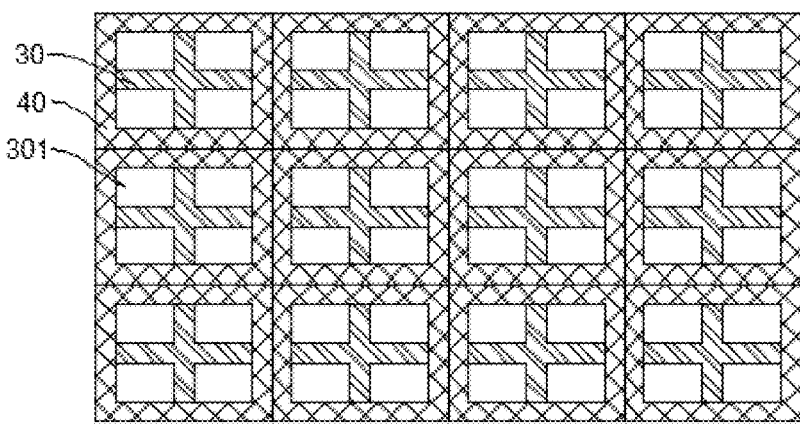
FIG. 6 is a schematic top view of a display backplane having a plurality of sub-protective layers according to an embodiment of the present application.

Specifically, as shown in FIGS. 5 and 6, the protective layer 30 may include a plurality of sub-protective layers 3001. Each of the sub-protective layers 3001 is provided with an accommodating groove 301. A sub-adhesive layer 4001 is disposed on a surface of the sub-protective layer 3001, and the sub-adhesive layer 4001 faces and contacts with the substrate 10. The sub-adhesive layer 4001 surrounds the light-emitting unit 20 in the accommodating groove 301 on the corresponding sub-protective layer 3001.

It is understood that the adhesive layer 40 is used to bond and seal the protective layer 30 with the substrate 10, thereby preventing water molecules in the air from eroding weld legs of the light-emitting unit 20, and improving stability of the display panel.

In an embodiment, the adhesive layer 40 is disposed to surround the light-emitting layer.

Specifically, in addition to surrounding the light-emitting layer, the adhesive layer 40 may be disposed on a contact surface between the protective layer 30 and the substrate 10 to further improve adhesion of the protective layer 30 with the substrate 10 and prevent the protective layer 30 from falling off.

It is understood that disposing the adhesive layer 40 around the light-emitting layer not only adheres the protective layer 30 to the substrate 10, but also effectively improves the sealing performance between the protective layer 30 and the substrate 10.

In an embodiment, the accommodating groove 301 may be provided in multiple and disposed on a surface of the protective layer 30 facing the light-emitting layer. At least one of the light-emitting units 20 is disposed in one accommodating groove 301.

Figure 3:
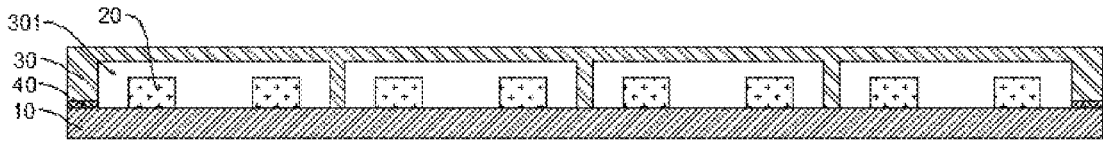
FIG. 3 is a schematic structural view of another display backplane according to an embodiment of the present application.
Figure 4:
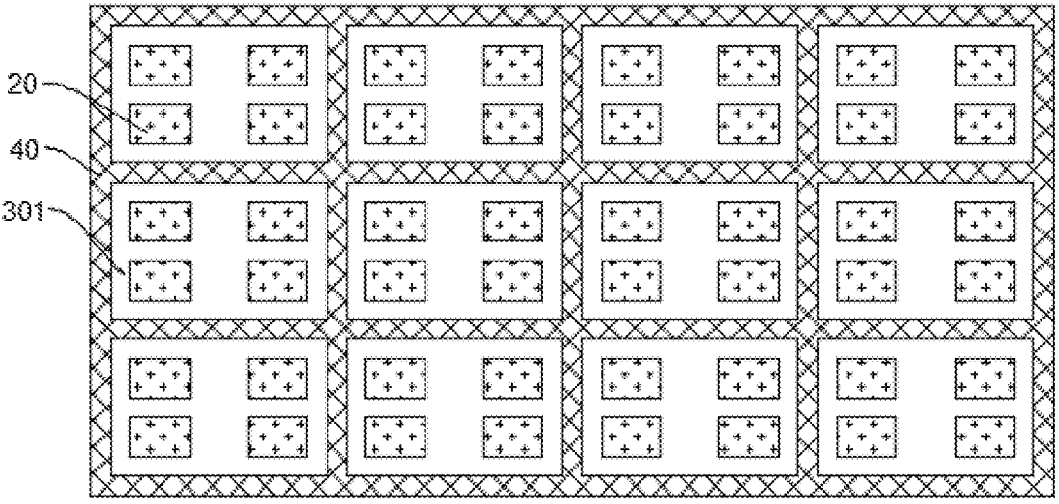
FIG. 4 is a schematic top view of a display backplane according to an embodiment of the present application.

Specifically, as shown in FIGS. 3 and 4, one of the accommodating grooves 301 is provided with one light-emitting unit 20 or a plurality of light-emitting units 20. Preferably, one light-emitting unit 20 is disposed in one of the accommodating grooves 301, so as to avoid that when a plurality of light-emitting units 20 are disposed in one of the accommodating grooves 301, a damaged Mini LED (for example, a Mini LED with corroded and broken weld legs that does not display properly) has an impact on other Mini LEDs that display properly.

It can be understood that by providing a plurality of accommodating grooves 301, it is possible to ensure that each of Mini LED elements of the display backplane can be better insulated from water and oxygen, extending the service life of the display backplane.

In an embodiment, the depth of the accommodating groove 301 in a direction perpendicular to the substrate 10 is greater than the height of the light-emitting layer.

Specifically, the area of the orthographic projection of the accommodating groove 301 on the substrate 10 is larger than the area of the orthographic projection of the light-emitting layer on the substrate 10, and the depth of the accommodating groove 301 is larger than the height of the light-emitting layer, so that the accommodating groove 301 in addition to the light-emitting element have extra space to dispose some other functional structures. For example, a reflection microstructure having a light-equalizing effect can be disposed on the substrate 10.

Mini LED display screens currently adopt a direct-type backlight module, and lamp shadows are liable to occur in an ultra-thin design. Depending on a light emission angle of the LED light source, a dark space may be generated between adjacent LEDs. When a light mixing distance between the lamps is not good, uneven brightness and darkness of a picture occurs, that is, a problem of lamp shadow.

Current methods to solve the lamp shadow problem mainly include reducing a distance between LEDs or increasing a light mixing distance. Both of the above two methods have disadvantages that, reducing the distance between LEDs requires an increase in the number of chips and in the cost of the backlight module, and increasing the light mixing distance requires an increase in the spacing between a Mini LED and a diffuser, which is unfavorable to the ultra-thin design of the display panel.

In an embodiment, a plurality of reflective microstructures 503 are disposed on the substrate 10, and the reflective microstructures 503 are located in the accommodating groove.

Specifically, the reflective microstructure 503 fully covers the substrate 10 within the accommodating groove 301.

Figure 7:
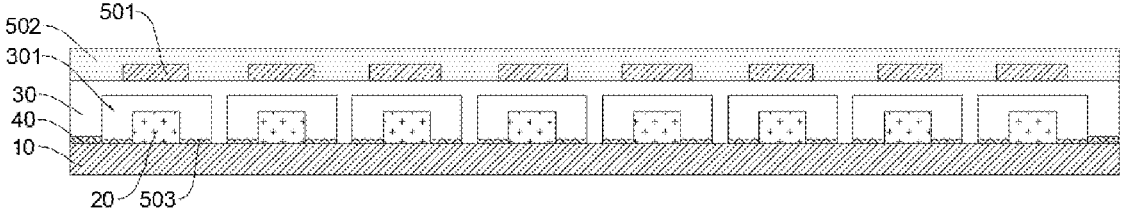
FIG. 7 is a schematic structural view of another display backplane according to an embodiment of the present application.

Specifically, as shown in FIG. 7, the reflective microstructure 503 may be made of inorganic particles or synthetic polymer particles. The reflective microstructure 503 is formed on a region of the substrate 10 corresponding to the accommodating groove 301 by coating, drying at a high temperature to remove a solvent and curing. The reflective microstructure 503 can perform a light equalization treatment on a part of the light reflected by the protective layer 30, increase a light range of the Mini LED light source, thereby achieving an effect of light mixing and light equalization, improving uniformity of a display image, and solving a lamp shadow problem of a display backplane.

In an embodiment, the reflective microstructure 503 includes a plurality of protrusions having a diameter in the range of 3 μm-16 μm.

Specifically, the diameter of the protrusion may be one of 3 μm, 5 μm, 7 μm, 8 μm, 9 μm, 10 μm, 12 μm, 13 μm, 15 μm, and 16 μm, where the diameter value is merely illustrative and the diameter of the protrusion may be any value in the range of 3 μm-16 μm.

In an embodiment, a semi-transparent layer is disposed on the protective layer 30. The orthographic projection of the semi-transparent layer on the substrate 10 covers the orthographic projection of the light-emitting layer on the substrate 10.

Specifically, as shown in FIG. 7, the brightness right over the LED chip is the strongest. In order to uniform brightness, a semi-transparent layer is provided right over the LED chip, thereby reducing the brightness right over the LED chip.

It can be understood that by providing a semi-transparent layer (ink shielding), a portion of the directly emitted light is blocked and the brightness of the central Mini LED is reduced to achieve uniform light-emitting effect. Meanwhile, by combining the reflective microstructure 503, light irradiates onto the ink and then is reflected back to the substrate 10, re-emitted by the reflective microstructure 503, so that an emission range of the Mini LED can be enlarged, and the light mixing effect can be improved.

In an embodiment, the semi-transparent layer includes a plurality of sub-semi-transparent layers 501, and one of the sub-semi-transparent layers 501 corresponds to one of the light-emitting units 20. The orthographic projection of the sub-semi-transparent layer 501 on the substrate 10 covers the orthographic projection of the corresponding light-emitting unit 20 on the substrate 10.

Specifically, a material used for the semi-transparent layer may be an ink coating. A shape of the sub-semi-transparent layer 501 may be circular, and a diameter of the sub-semi-transparent layer 501 is larger than that of the light-emitting unit 20. Mini LED emits light as a Lambertian light source with a brightness range larger than the diameter of the chip. A density of the ink in the middle of the semi-transparent layer is the largest, and gradually decreases toward the edge of the semi-transparent layer. The ink can block light transmission wherein variation of the ink density results in different shielding effect on light.

Specifically, the semi-transparent layer may be formed by ink-jet printing or the like.

It can be understood that, by providing a circular sub-semi-transparent layer 501 (ink shielding) corresponding to the Mini LED and facing the center of the corresponding light-emitting unit 20, the sub-semi-transparent layer 501 can block a part of the directly emitted light, effectively reduce the brightness at the center of the Mini LED, and ensure that the light can be emitted uniformly at a position farther away from the center light-emitting area of the Mini LED, without reducing the brightness of the display back-plane, so as to achieve an effect of uniformly emitting light. Meanwhile, by combining the reflective microstructure 503, light irradiates onto the ink (sub-semi-transparent layer 501) and is reflected back to the substrate 10, re-emitted by the reflective microstructure 503, further enlarging an emission range of the Mini LED and improving the light mixing effect.

In an embodiment, a scattering layer 502 is disposed on the protective layer 30, and the scattering layer 502 covers the protective layer 30.

Specifically, the scattering layer 502 covers the entire top surface of the protective layer 30 and can be formed by coating a colloid doped with diffusion particles or the like.

Specifically, the diffusion particles may be inorganic particles or synthetic polymer particles, and a size range of the diffusion pieces or particles may be 3 μm-16 μm.

It can be understood that, by providing the semi-transparent layer and reflective layer on the protective layer 30 and providing the reflective microstructure 503 on the substrate 10, a light emission range of the light-emitting unit 20 is enlarged through the cooperation of the three structures, thereby achieving the effects of light homogenization and light mixing, solving the lamp shadow problem of the direct-type backlight structure, improving display uniformity of the display backplane, and having less impact on display brightness.

In addition, the present application further provides a mobile terminal comprising the display backplane according to any one of the foregoing embodiments and a terminal body, wherein the terminal body is integrated with the display backplane.

In summary, in the present application, a protective layer 30 is provided on the substrate 10, the protective layer 30 covers the light-emitting layer, an accommodating groove 301 is provided on a surface of the protective layer 30 facing the light-emitting layer, the accommodating groove 301 and the substrate 10 constitute together an accommodating cavity, and the light-emitting unit 20 is located in the accommodating cavity. By this configuration, the light-emitting unit 20 is not adhered to the protective layer 301 after packaging, and the light-emitting layer can be protected by the protective layer 30. In the subsequent process, when the light-emitting unit 20 is defective and needs to be returned to the factory for replacement, the protective layer 30 can be removed and then replace any of the light-emitting units 20 alone, without replacing the entire lamp board, thereby reducing the maintenance costs of the display backplane, and achieving energy saving and environmental protection.

At the same time, by providing a semi-translucent layer and a reflective layer on the protective layer 30 and a reflective microstructure 503 on the substrate 10, a portion of the light directly emitted from the brightest part of the center of the Mini LED is blocked by a sub-semi-translucent layer 501 to reduce the brightness of the central Mini LED, and the reflected light is reflected back to the substrate 10 and re-emitted through the reflective microstructure 503 to further expand a light-emitting range of Mini LED. The light around the non-sub-semi-translucent layer 501 is scattered through the scattering layer 502 to enhance the brightness and thus the brightness in the center is reduced, thereby achieving uniformity of the brightness of the display backplane, improving the light mixing effect, expanding the light-emitting range of the light-emitting unit 20, solving the light shadow problem of a direct-type backlight structure, improving display uniformity of the display backplane, and having less impact on the display brightness.

The display backplane and the mobile terminal provided in the embodiments of the present application are described in detail above. Specific examples are used to illustrate the principles and implementations of the present application herein. The description of the embodiments is merely intended to help understand the method and core ideas of the present application. Meanwhile, there will be changes in the specific implementation and the scope of application for a person skilled in the art according to the idea of the present application. In conclusion, the content of the specification should not be construed as a limitation to the present application.

It can be understood that equivalent substitutions or changes may be made for a person of ordinary skill in the art in accordance with the technical solutions and inventive concepts of the present application, and all such changes or substitutions shall fall within the scope of the claims appended hereto.

What is claimed is:

1. A display backplane, comprising:
a substrate;
a light-emitting layer disposed on the substrate and including a plurality of light-emitting units arranged at intervals;
a protective layer disposed on the substrate, wherein a plurality of accommodating grooves are disposed in a surface of the protective layer facing the substrate, and
a reflective microstructure disposed on the substrate and surrounding a periphery of the light-emitting units,
wherein the light-emitting units and the reflective microstructure are both located in the accommodating grooves of the protective layer, the protective layer covers the light-emitting units and the reflective microstructure, and the reflective microstructure comprises a plurality of protrusions, and
the display backplane comprises a semi-transparent layer disposed on a surface of the protective layer away from the substrate, the semi-transparent layer comprises a plurality of sub-semi-transparent layers, each of the sub-semi-transparent layers covers corresponding one of the light-emitting units, and an ink density of the sub-semi-transparent layers at the center among the plurality of sub-semi-transparent layers is the highest and decreases gradually toward the sub-semi-transparent layers at the edges among the plurality of sub-semi-transparent layers.

2. The display backplane of claim 1, wherein the plurality of protrusions have a diameter in a range of 3 μm-16 μm.

3. The display backplane of claim 1, wherein an orthographic projection of the semi-transparent layer on the substrate covers an orthographic projection of the light-emitting layer on the substrate.

4. The display backplane of claim 3, wherein an orthographic projection of the sub-semi-transparent layer on the substrate covers an orthographic projection of the corresponding light-emitting unit on the substrate.

5. The display backplane of claim 3, wherein the protective layer is provided with a scattering layer to cover the protective layer and the semi-transparent layer.

6. The display backplane of claim 1, wherein an adhesive layer is disposed between the protective layer and the substrate, and the adhesive layer securely adheres to the protective layer and the substrate.

7. The display backplane of claim 6, wherein the adhesive layer is disposed around the light-emitting layer.

8. The display backplane of claim 1, wherein at least one of the light-emitting units is disposed in one of the accommodating grooves.

9. The display backplane of claim 1, wherein a depth of each of the accommodating grooves is greater than a height of the light-emitting layer in a direction perpendicular to the substrate.

10. A mobile terminal comprising a display backplane and a terminal body, the terminal body being integrated with the display backplane;
wherein the display backplane comprises:
a substrate;
a light-emitting layer disposed on the substrate and including a plurality of light-emitting units arranged at intervals;
a protective layer disposed on the substrate, wherein a plurality of accommodating grooves are disposed in a surface of the protective layer facing the substrate, and
a reflective microstructure disposed on the substrate and surrounding a periphery of the light-emitting units,
wherein the light-emitting units and the reflective microstructure are both located in the accommodating grooves, the protective layer covers the light-emitting units and the reflective microstructure, and the reflective microstructure comprises a plurality of protrusions, and
the display backplane comprises a semi-transparent layer disposed on a surface of the protective layer away from the substrate, the semi-transparent layer comprises a plurality of sub-semi-transparent layers, each of the sub-semi-transparent layers covers corresponding one of the light-emitting units, and an ink density of the sub-semi-transparent layers at the center among the plurality of sub-semi-transparent layers is the highest and decreases gradually toward the sub-semi-transparent layers at the edges among the plurality of sub-semi-transparent layers.

11. The mobile terminal of claim 10, wherein the plurality of protrusions have a diameter in a range of 3 μm-16 μm.

12. The mobile terminal of claim 10, wherein an orthographic projection of the semi-transparent layer on the substrate covers an orthographic projection of the light-emitting layer on the substrate.

13. The mobile terminal of claim 12, wherein an orthographic projection of the sub-semi-transparent layer on the substrate covers an orthographic projection of the corresponding light-emitting unit on the substrate.

14. The mobile terminal of claim 12, wherein the protective layer is provided with a scattering layer to cover the protective layer and the semi-transparent layer.

15. The mobile terminal of claim 10, wherein an adhesive layer is disposed between the protective layer and the substrate, and the adhesive layer securely adheres to the protective layer and the substrate.

16. The mobile terminal of claim 15, wherein the adhesive layer is disposed around the light-emitting layer.

17. The mobile terminal of claim 10, wherein at least one of the light-emitting units is disposed in one of the accommodating grooves.

18. The mobile terminal of claim 10, wherein a depth of each of the accommodating grooves is greater than a height of the light-emitting layer in a direction perpendicular to the substrate.

19. The display backplane of claim 1, wherein a surface of the protective layer away from the substrate is a planar structure, and is disposed over an entire surface of the substrate.

20. The display backplane of claim 2, wherein a height of the protrusions is less than a height of the light-emitting units, and the reflective microstructure completely covers the substrate within each of the accommodating grooves.

* * * * *